(12) United States Patent
Kapur et al.

(10) Patent No.: US 7,875,522 B2
(45) Date of Patent: Jan. 25, 2011

(54) SILICON COMPATIBLE INTEGRATED LIGHT COMMUNICATOR

(75) Inventors: Pawan Kapur, Palo Alto, CA (US); Michael West Wiemer, Los Altos, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/057,959

(22) Filed: Mar. 28, 2008

(65) Prior Publication Data
US 2008/0272391 A1 Nov. 6, 2008

Related U.S. Application Data

(60) Provisional application No. 60/909,330, filed on Mar. 30, 2007.

(51) Int. Cl.
*H01L 21/331* (2006.01)
(52) U.S. Cl. ............... 438/341; 438/479; 438/481; 438/492; 257/E21.086
(58) Field of Classification Search ............. 257/94, 257/101, 103; 438/341, 479, 481, 492
See application file for complete search history.

(56) References Cited

U.S. PATENT DOCUMENTS 6,897,471 B1   5/2005   Soref et al.
6,946,318 B2   9/2005   Wada et al.

2006/0252235 A1*  11/2006   Aberle et al. ............... 438/478
2006/0267017 A1*  11/2006   Noguchi et al. ............... 257/66

FOREIGN PATENT DOCUMENTS

WO    WO2005/094254    10/2005

OTHER PUBLICATIONS

S. Balakumar et al. "Fabrication Aspects of Germanium on Insulator from Sputtered Ge on Si-Substrates." Electrochemical and Solid State Letters, vol. 9, No. 5, G158-G160 (2006).
O. Dosunmu et al. "Resonant Cavity Enhanced Ge Photodetectors for 1550 nm Operation on Reflecting Si Substrates." IEEE journal of Selected Topics in Quantum Electronics, vol. 10, No. 4, p. 694-701 (Jul./Aug. 2004).

* cited by examiner

*Primary Examiner*—Wai-Sing Louie
(74) *Attorney, Agent, or Firm*—Crawford Maunu PLLC

(57) ABSTRACT

Various methods and devices are implemented using efficient silicon compatible integrated light communicators. According to one embodiment of the present invention, a semiconductor device is implemented for communicating light, such as by detecting, modulating or emitting light. The device has a silicon-seeding location, an insulator layer and a second layer on the insulator layer. The second layer includes a silicon-on-insulator region and an active region surrounded by the silicon-on-insulator region and connected to the silicon-seeding location. The active region includes a single-crystalline germanium-based material that extends from the silicon-seeding location through a passageway with a cross-sectional area that is sufficiently small to mitigate crystalline growth defects. The single-crystalline germanium-based material is physically coupled to the insulating layer such that the insulating layer introduces a high tensile strain to the germanium-based material, and a more specific aspect is directed to an SOI implementation.

22 Claims, 5 Drawing Sheets

SILICON COMPATIBLE INTEGRATED LIGHT COMMUNICATOR

RELATED PATENT DOCUMENT

This patent document claims benefit under 35 U.S. §119(e) of U. S. Provisional Application Ser. No. 60/909,330 filed on Mar. 30, 2007 and entitled "Silicon Compatible Integrated Light Communicator;" this patent document is incorporated by reference in its entirety.

FIELD OF THE INVENTION

The present invention relates generally to a silicon compatible integrated light communicator and more particularly to arrangements for sourcing, detecting, amplifying, and modulating light using such circuits.

BACKGROUND

For some time, the engineering community has been challenged by the impracticality of a silicon-based device to meet ongoing demands for emitting and receiving light of certain wavelengths in various applications. These challenges have been heightened due to a tremendous and relatively recent increased interest in silicon-based photonics. Both the computing and the telecommunications industry have struggled to develop electrical interconnects for short distances, at a pace that is commensurate with an ever-increasing demand for communication bandwidth. Such development is hampered by limitations inherent to electrical interconnects and due to the enormous complexity and power required to achieve high communication bandwidth. A major impediment to an all-silicon photonics solution is the implementation of a monolithic silicon and CMOS compatible light-emitter including a laser. While there are a number of commercially-available flip-chip bondable lasing devices that can, in principle, enable optical interconnects, such devices render relatively low bonding yields that result in overall high chip costs, thereby presenting a significant barrier for replacement of electrical interconnects by optical interconnects.

In many applications, technological advancements are practicably realized by implementing new circuit elements/arrangements directly on silicon, for example, using a monolithic CMOS compatible process. Such an implementation enables the technologies to ride on a multi-billion dollar silicon manufacturing infrastructure, accompanied by the inherent volume nimbleness, and mitigation of capital/operational expenses through sharing with other CMOS IC companies. For development or growth directly on silicon, materials need to be compatible. Since silicon is an indirect bandgap material, the radiative recombination efficiency for light emission is very low compared to direct bandgap III-V materials. Other silicon compatible materials, such as Germanium (Ge), have recently become common in a mainstream CMOS fabrication facility, at least in low concentration. Further, Ge is rigorously being researched because of its superior electrical properties. However, Ge in its bulk, unstrained form, is also an indirect bandgap material, and suffers from some of the same light emission inefficiency problems as silicon.

Apart from light emission and laser, other key components of silicon-photonics are an efficient light detector, light modulator, and light amplifier. For a light/photodetector, there is a strong need to have a highly-responsive, efficient photodetector that also meets two important criteria. First, the photodetector should be compatible with the telecommunication standards, which operate at a wavelength near 1550 nm. Second, the photodetector should be compatible with silicon manufacturing processes, so that it can be produced inexpensively. Light absorption required for detection is altogether absent in silicon around 1550 nm wavelengths, thus rendering it unworthy as a detector at these wavelengths. To the extent that the silicon IC industry would progressively use more Ge in the form of SiGe compounds for transistor mobility enhancement, the variety and importance for these applications can increase dramatically. Ge by itself can serve as an excellent photodetector at 1310 nm wavelength (with an absorption of ~7000 $cm^{-1}$ at 1310 nm), but it is a poor detector at 1550 nm with an absorption coefficient of only around 450 $cm^{-1}$. Optical devices, such as detectors and modulators, would benefit from reduction in the bandgap of Ge regardless of whether the bandgap was indirect or direct. For instance, a reduction in bandgap can improve the detection of low energy photons due to the smaller amount of energy necessary to move electrons between the valence band and the conduction band.

Several different types of photodetectors exist, including (but not limited to) metal semiconductor metal (MSM), PIN, and waveguide detectors. A photodetector can be evaluated based on its: 1) responsivity or quantum efficiency (which can impact signal-to-noise ratio), 2) the flatness or uniformity of its response to wavelengths around a central wavelength, for example, around the commonly deployed communication wavelength of 1550 nm, 3) transit time (which can impact device speed), 4) capacitance (which impacts the bandwidth, the signal-to-noise ratio at the front-end and power consumption), 5) bandwidth, 6) dark current (important to signal-to-noise ratio and power dissipation), 7) power dissipation, and 8) area. In detector designs, there is typically a tradeoff between these performance parameters. For example, ordinary Ge, despite its low absorption at 1550 nm, can be made into a high-responsivity detector by making it long in a waveguide implementation. However, the penalty for this is high dark current, large capacitance, and possibly, bandwidth reduction.

A reduction in the capacitance typically associated with conventional silicon applications has been realized using silicon-on-insulator (SOI) structures. As the name suggests, SOI refers to the use of a layered silicon-insulator-silicon substrate with the silicon junction being above the electrical insulator and isolated from the bulk silicon to provide a lower parasitic capacitance. However, the epitaxial silicon typically used in the SOI structure is less than desirable for many applications. For instance, silicon exhibits a relatively high and indirect bandgap, and thus, has a poor response to light having certain wavelengths, such as wavelengths (near) infrared wavelengths. Germanium is an example material that can be a desirable alternative to silicon for a variety of applications. For instance, germanium is a promising channel material for MOS-type transistors due to this high carrier mobility. Germanium also has other material properties that differ from silicon, such as a smaller bandgap. These properties facilitate optoelectronic devices and many additional device options. In the past few decades, investigations have been conducted regarding the use of non-silicon materials, such as germanium, for integrated circuit applications due to their enhanced qualities relative to other types of semiconductor materials, such as silicon.

Single-crystal materials are desirable for use in active regions due to their characteristics relative to, for example, polycrystalline materials. However, single-crystal materials, such as germanium, are difficult to manufacture on a silicon platform including the bulk Si and SOI wafers. Lattice mismatch may exist between any two different types of crystalline materials. For instance, one way to grow germanium is to directly use epitaxy methods at a seed interface that includes silicon, a lattice mismatch (e.g., about 4 percent) between the germanium and silicon can result in compressive stress on the germanium. Moreover, such an approach of directly growing pseudomorphically strained Ge on Si is limited to thin films of Ge (e.g., on the order of only a few nanometers thick), because pure Si (4 percent) limits the thickness to only a few nanometers before defects are realized. For many applications, a much larger thickness is desirable because it would result in increased absorption of light. Approaches to reducing the bandgap and/or creating a direct bandgap in germanium, such as those using a virtual substrate as taught by U.S. Pat. No. 6,897,471 to Soref et al., have been relatively complex and difficult to use.

Some other techniques for creating thicker germanium films require the films to be in contact with silicon. Moreover, such techniques often also require a prolonged anneal step at high temperature (e.g., around 900° C.) after growing Ge to anneal the defects. This, in general, eats up a lot of thermal budget for other CMOS devices, thus rendering a non-seamless integration with CMOS flow. In particular, a prolonged high temperature anneal leads to diffusion of silicon into germanium at the interface, which dilutes germanium concentration, increasing its bandgap, and reducing absorption efficiency.

Thus, these and other critical issues of desired band-structure modification of Ge as well as the growth of thick and thin Ge films in a true silicon and CMOS compatible manner and other aforementioned issues have presented challenges to the implementation and design of efficient light communicator circuits. Accordingly, there is a need for active optical devices that are easy to manufacture on a silicon platform and that provide efficient light-emission and amplification, modulation, and high responsivity/uniform detection for wavelengths used in communication standards.

SUMMARY

In various embodiments, the present invention is directed to optical devices using strained Germanium and/or to such devices and methods that overcome one or more of the above-mentioned challenges. The present invention is exemplified in a number of implementations and applications, some of which are summarized below.

According to one aspect, the present invention is directed to implementing a light-emitter and a laser directly on silicon using a monolithic CMOS compatible process providing optical communication at a very cheap cost.

According to another aspect, the present invention is directed to monolithically growing a single crystal Ge in a CMOS compatible process. A tensile strain is introduced in the Ge to shift the band curvature and relative valleys in a manner that permits for efficient light communication, whether by detecting, modulating, emitting, or amplifying light.

According to another aspect, a semiconductor device is implemented for communicating light such as by detecting, modulating, emitting, or amplifying light. The device includes a silicon-seeding location and an insulator layer. A second layer is located on the insulator layer. The second layer includes a silicon-on-insulator region and an active region surrounded by the silicon-on-insulator region and connected to the silicon-seeding location. The active region includes a single-crystalline germanium-based material. The single-crystalline germanium-based material extends from the silicon-seeding location through a passageway with a cross-sectional area that is sufficiently small to mitigate crystalline growth defects as a crystalline growth front of the liquid-phase material passes through the passageway. The single-crystalline germanium-based material is physically coupled to the insulating layer such that the insulating layer introduces a tensile strain to the germanium-based material.

According to another aspect, a semiconductor device is implemented for communicating light. The device comprises a silicon-seeding location, a reflective layer for directing light to the active region, and an active region on the reflective layer which may or may not be connected to the silicon-seeding location. The active region includes a single-crystalline germanium-based material. The single-crystalline germanium-based material extends from the silicon-seeding location through a passageway with a cross-sectional area that is sufficiently small to mitigate crystalline growth defects as a crystalline growth front of the liquid-phase material passes through the passageway. The single-crystalline germanium-based material is physically coupled with the reflective layer and has a tensile strain due to the physical coupling with the reflective layer.

Another aspect is directed to a method of manufacturing a light-communicating semiconductor device such as a device for detecting, modulating, emitting, or amplifying light. A germanium-based material is deposited onto a semiconductor device. The germanium-based material is changed to a semi-solid state using heat. Growth of a crystalline structure, from the germanium-based material, is directed along a path beginning at a seeding location. The growth passes through a small opening that mitigates defects in the grown crystalline structure and continuing adjacent to another material. The grown crystalline structure and the adjacent material are cooled, thereby introducing a tensile strain to the crystalline structure due to a difference in the thermal expansion coefficient.

Other aspects of the present invention are directed to a modified form of Ge, which is compatible with silicon processing and will yield absorption approaching that of 1310 nm wavelengths at 1550 nm wavelength, thus meeting the aforementioned criteria.

Other aspects of the present invention are directed to a semiconductor device for communicating light. The device comprises an active region having a single-crystalline germanium-based material having a thickness exceeding 50 nm. The single-crystalline germanium-based material physically couples to a layer that introduces a high-tensile strain to the single-crystalline germanium-based material.

The above summary of the present invention is not intended to describe each illustrated embodiment or every implementation of the present invention. The figures and detailed description that follow more particularly exemplify certain embodiments.

BRIEF DESCRIPTION OF THE DRAWINGS

The invention may be more completely understood in consideration of the detailed description of various embodiments of the invention that follows in connection with the accompanying drawings, in which.

Figure 1:
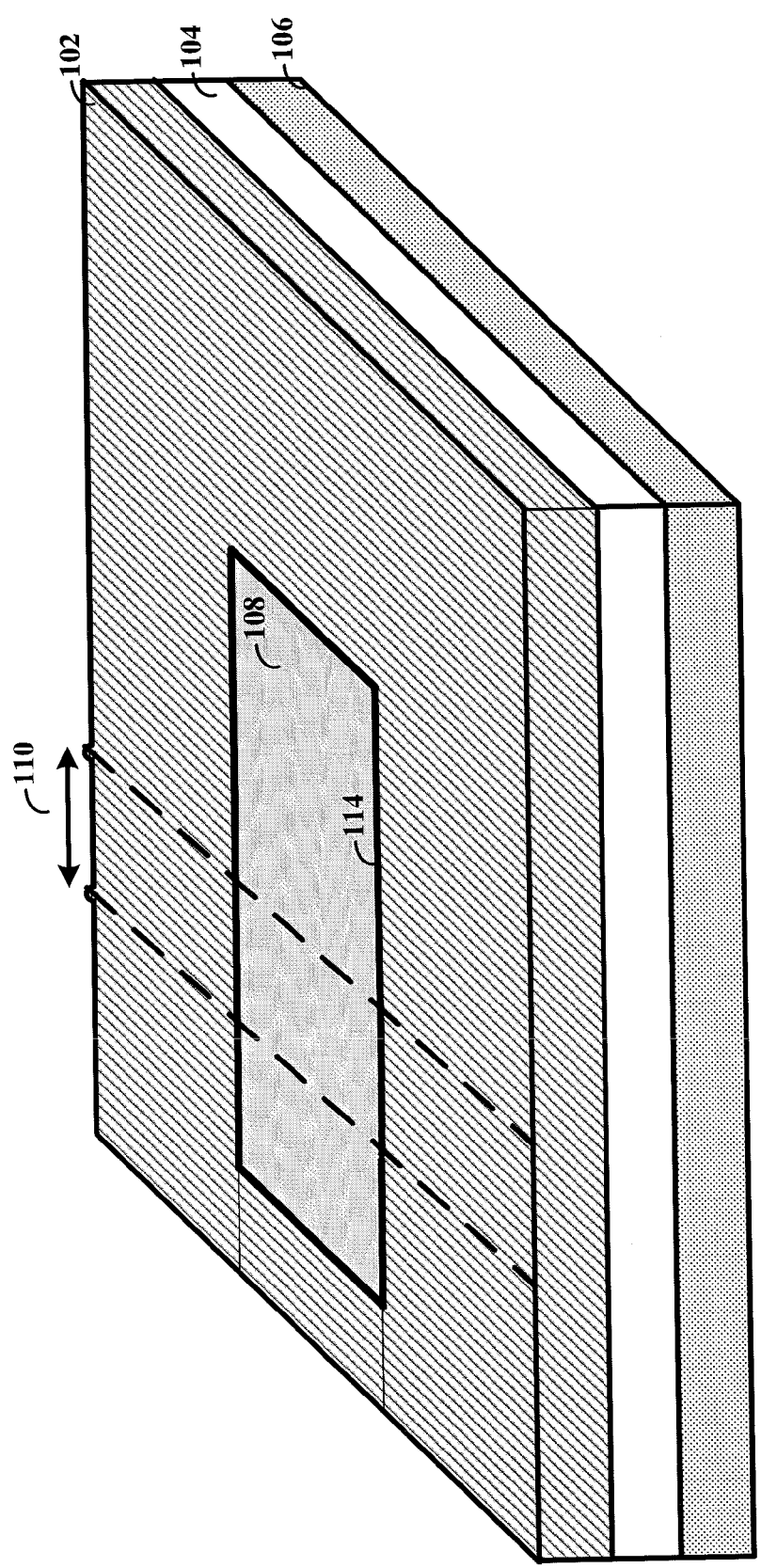
FIG. 1 depicts a semiconductor device for detecting, modulating, amplifying or emitting light, according to one example of the present invention.

While the invention is amenable to various modifications and alternative forms, specifics thereof have been shown by way of example in the drawings and will be described in detail. It should be understood, however, that the intention is not necessarily to limit the invention to the particular example embodiments described and claimed. On the contrary, the intention is to cover all modifications, equivalents, and alternatives falling within the spirit and scope of the invention.

DETAILED DESCRIPTION

The present invention is believed to be useful for a variety of different applications involving silicon compatible optical devices, and the invention has been found to be particularly suited for realizing and improving the optical devices designed for light having wavelengths around 1550 nm. While the present invention is not necessarily limited to such applications, various aspects of the invention may be appreciated through a discussion of several examples using this context.

According to one example embodiment of the present invention, an all silicon photonics solution is implemented to address issues related to a cost-competitive replacement of electrical interconnects using optical interconnects and to a reduction of the form factor of photonics by miniaturization and integration in a standard CMOS foundry environment.

According to an example embodiment of the present invention, an optical semiconductor device is implemented using a single-crystalline material with favorable optical properties. In one instance, the single-crystalline material is a Ge-based material with a reduced bandgap, primarily arising from the direct bandgap lowering (gamma valley in the conduction band and the hole valence band moving up). In a more specific instance, the single-crystalline material is a Ge-based material having a direct bandgap or very close to it. The Ge-based material is grown from a seeding location onto the device to create an active region. The active region can be surrounded by other semiconductor material, such as material commonly used for silicon-on-insulator devices. This is particularly useful for creating optical devices that are compatible with silicon-based processes.

In a more specific implementation, the Ge-based material is formed using a rapid-melt-growth (RMG) process that produces a single-crystalline structure. Temperature variation occurring during the formation of the single-crystalline structure results in a Ge-based material with tensile strain at operating temperatures (e.g., room temperature or the maximum operating temperature of the device). In one such implementation, the Ge-based material has a relatively high tensile strain (e.g., greater than about 0.2 percent). This high tensile strain can be selectively implemented up to and exceeding one percent.

Defects in the Ge-based crystalline material resulting from lattice mismatches between the silicon substrate and the Ge-based crystalline material can be mitigated using various techniques. One such technique is sometimes referred to as a necking technique. Periodic defects can occur along the interface of the Ge-based crystalline material and the silicon substrate. By confining subsequent growth of the Ge-based crystalline material to a small cross-section area or neck, the effect of the periodic defects can be reduced. For further details of such necking techniques, reference can be made to "Fabrication Aspects of Germanium on Insulator from Sputtered Ge on Si-Substrates" Balakumar et al, Electrochemical and Solid State Letters, Vol. 9, No. 5, G158-G160 (2006) and to "Crystalline-Type Device and Approach Thereof," Yaocheng, Liu et al., international PCT application publication number 2005/094254 A2, published on Oct. 13, 2005, which are fully incorporated herein by reference.

According to an example embodiment of the present invention a Ge-based material is created using an epitaxial growth to create an optical device. Direct epitaxy is performed at a seeding location and a crystal grown from the seeding location and passed through a necking area to remove defects.

The Ge-based crystalline material can be grown onto a material having a coefficient of expansion different from the Ge-based crystalline material. By controlling the temperature and length of the growth phase it has been found that, upon cooling, the Ge-based crystalline material has a relatively high tensile strain. Under certain conditions, the strained crystalline material becomes either a direct bandgap material with a low bandgap or sufficiently close to a direct bandgap to provide efficient light generation, such as where the indirect conduction band (L-valley) is only 10 s of meV below the direct conduction band (gamma-valley). This is particularly useful for efficient optical devices, such as modulators, lasers, light-emitting diodes, optical amplifiers, and detectors. One skilled in the art would recognize that various composite Ge materials can be implemented in place of pure Ge. The purity of the Ge and the specific type of composite materials used can be selected based upon the particular application. Unless otherwise stated, the term Ge represents both pure Ge and a composite Ge-based material, such as SiGe, having various concentrations of each material.

According to another example embodiment, substantially single-crystal Ge-based material is grown over an insulator using semi-liquid-phase epitaxy to produce tensile strain in the single-crystal material. By growing the single-crystal material at a temperature less than the melting point of the single-crystal material and over another material with suitable characteristics (e.g., coefficient of expansion), the resulting single-crystal material has been shown to exhibit a high tensile strain. Crystalline growth is initiated with a semi-liquid-phase material near a seed location from which a crystallization front propagates. Defects typically associated with the seed location (e.g., due to a lattice mismatch between the liquid-phase material and the substrate) that characterize the initial crystalline growth are mitigated (e.g., reduced or eliminated) using a defect-necking approach. In some instances, this defect-necking approach involves the promotion of a crystalline growth front propagation through a relatively narrow aperture that mitigates the tendency of defects such as dislocations or stacking faults from characterizing the crystalline growth. In other instances, the defect-necking approach involves the promotion of a change in direction of the propagation front of the crystalline growth, the change in direction similarly mitigating defects.

Such approaches can be particularly useful for creating defect free, thick films of Ge-based material with high tensile strain. More specifically, the manufacturing techniques can be suitable for a range of thicknesses from about 20 nm to thick films up to and exceeding 300 nm. The low defects exhibited in the Ge-based material provide benefits for many optical devices. Low-defect density is particularly useful for laser-based applications. For photodetectors, low-defect density can be useful for reducing dark current and facilitates higher responsivity especially at low (e.g., CMOS compatible voltages of 1-1.5V) applied bias, because the presence of defects adversely impacts photo-generated carrier mobility and recombination rate.

In one implementation, an inert-type material (i.e., material that is substantially unreactive with the liquid-phase material) is used to contain the liquid-phase material and promote the defect-necking approach discussed above. The inert-type material and the substrate have a high melting point, relative to the melting point of the liquid-phase material. In addition, the inert-type material is physically arranged to promote the above-discussed necking of defects that form as the liquid-phase material crystallizes. For instance, the inert-type material may be arranged having a relatively small cross-section through which the propagation front passes or having a shape that forces the propagation front to change direction as the liquid phase material crystallizes. In some instances, defects are mitigated using the physical arrangement of the inert-type material to promote defect necking via mechanisms similar to those characterizing Czochralski-type crystalline growth. For general information regarding Czochralski-type crystalline growth and for specific information regarding growth mechanisms that can be implemented in connection with one or more of the example embodiments discussed herein, reference may be made to Balasubramaniam, R. and Ostrach, S., "Fluid Motion in the Czochralski Method of Crystal Growth," PCH PhysicoChemical Hydrodynamics, Pergamon Press Ltd, Great Britain, Vol. 5(1), pp. 3-18, 1984, which is fully incorporated herein.

For the band structure of relaxed germanium, the L valley forms the indirect bandgap at 0.67 eV, while the direct bandgap gamma valley is about 0.8 eV above the hole gamma point. A tensile strain in Ge moves the electron gamma valley down toward the top of the valence band and also moves up the hole valence band top toward the gamma valley, resulting in a reduction of the direct bandgap. Tensile strain also causes the L valley to move up slightly. This will ultimately result in gamma point to be very close or lower than the L valley making high tensile Ge a direct bandgap material. Thus, a highly efficient light emitter can be realized using direct bandgap radiative recombination. Strain on the order of 1 percent is enough to reduce gamma and L-valley difference by about 100-130 meV compared to the light hole valence band (130 meV is the difference between L and the gamma valley in relaxed Germanium). Another consequence of tensile strain is a split-off between heavy and light hole valence bands with light hole representing the top of the valence band.

Moreover, a material's ability to absorb light varies exponentially with respect to its coefficient of absorption. Accordingly, the ability to absorb light falls off quickly at a certain wavelength. For instance, the absorption ability of unstrained Ge begins to fall off near infrared wavelengths longer than 1310 nm and falls sharply after 1550 nm. Thus, shifting the absorption of Ge at higher wavelengths, by introducing a tensile strain, can be particularly useful for increasing the range of a Ge based detector to include wavelengths near 1550 nm or longer with high responsivity. This can also be useful for creating similar (e.g., near uniform) responses across wavelengths at or near 1550 nm. For example, applications that perform wavelength division multiplexing (and similar functions) can be easily implemented using a detection device that provides such similar (e.g., near uniform) responses.

Turning now to the figures, FIG. 1 depicts a semiconductor device for detecting, modulating, amplifying, or emitting light, according to one example embodiment of the present invention. Layers 102, 104 and 106 show a silicon layer, an insulator layer and a silicon substrate later, respectively. Region 108 represents a single-crystalline Ge-based region. The region 108 is formed such that it is surrounded by layer 102. To prevent problems due to interfacing between the Ge region 108 and layer 102, an inert layer 114 can be used to separate layers 108 and 102. This separation can be useful for controlling factors including, but not limited to, lattice mismatches and inter-diffusion between the region 108 and layer 102 and in some instances can serve as an optical layer useful for efficient lateral light coupling using index matching between active and passive optical regions.

In one instance, region 108 includes a single crystalline material. By implementing the RMG process described herein, it is possible to generate strained-Ge material having a reduced (even a direct) bandgap. For instance, during the melting phase of an RMG process, the temperature of the Ge material is kept slightly below the melting point (e.g., around 938° C.). At this temperature the Ge material is kept in a semi-solid state. The crystal growth is propagated from a seeding location. The thermal expansion coefficient of Ge is much higher than the insulator (oxide or nitride). During cooling, Ge wants to contract to its relaxed state at room temperature, but is held to a much higher lattice constant by the insulator with a lower coefficient of expansion, leading to a high tensile strain.

The amount of tensile strain introduced to the Ge material can be controlled by varying the manufacturing process. For instance, the control of the tensile strain can be accomplished by varying the temperature during the melt and growth phase of the process. If the temperature during the melting phase is near or above the melting point, the resulting crystal exhibits little, if any, tensile strain. If the Ge material is heated to a temperature below the melting point, it has been shown to exhibit tensile strains that vary in response to the precise temperature and length of heating. Accordingly, the process can be used to control the tensile strain. This is particularly useful for controlling the band-structure including the band gap and absorption coefficient as well as other properties. For instance, photodetectors can be designed with different coefficients of absorption. This can be particularly useful for developing photo-detectors useful for detecting specific frequencies of light, while allowing other frequencies to pass. Another example includes tuning the devices relative to their effective modulation of different frequencies of light, thus creating a light-modulation device which operates at the desired light frequency and is controlled by electrical voltage.

Using common fabrication techniques, a number of different Ge-based regions can be formed on a single semiconductor device. For instance, layer 102 can be silicon to allow for easy etching of the silicon and Ge-based regions to provide well-aligned silicon and Ge-based regions. Examples include, coupling of SOI waveguides to Ge-based LEDs, lasers, detectors, amplifiers and modulators. The coupling can be butt-coupled waveguides, ring-oscillator, evanescently-coupled waveguides, or similar types of circuits. For instance, butt coupling of an SOI waveguide to a Ge-based region can be accomplished by a single etching step at dotted lines 110. Alternatively, multiple etching steps can be used if the alignment between the steps is maintained.

According to another example embodiment of the present invention, layer 102 can be implemented using material other than silicon. For instance, surface-normal optical devices (e.g., optical devices that interact with light traveling substantially perpendicular to the substrate) can be implemented. Many of such surface-normal optical devices do not require the same coupling between layer 102 and the active area 108.

Thus, layer 102 can be implemented using various dielectrics or inert/crucible structures. In some instances, layer 102 is removed from the final device.

Figure 2:
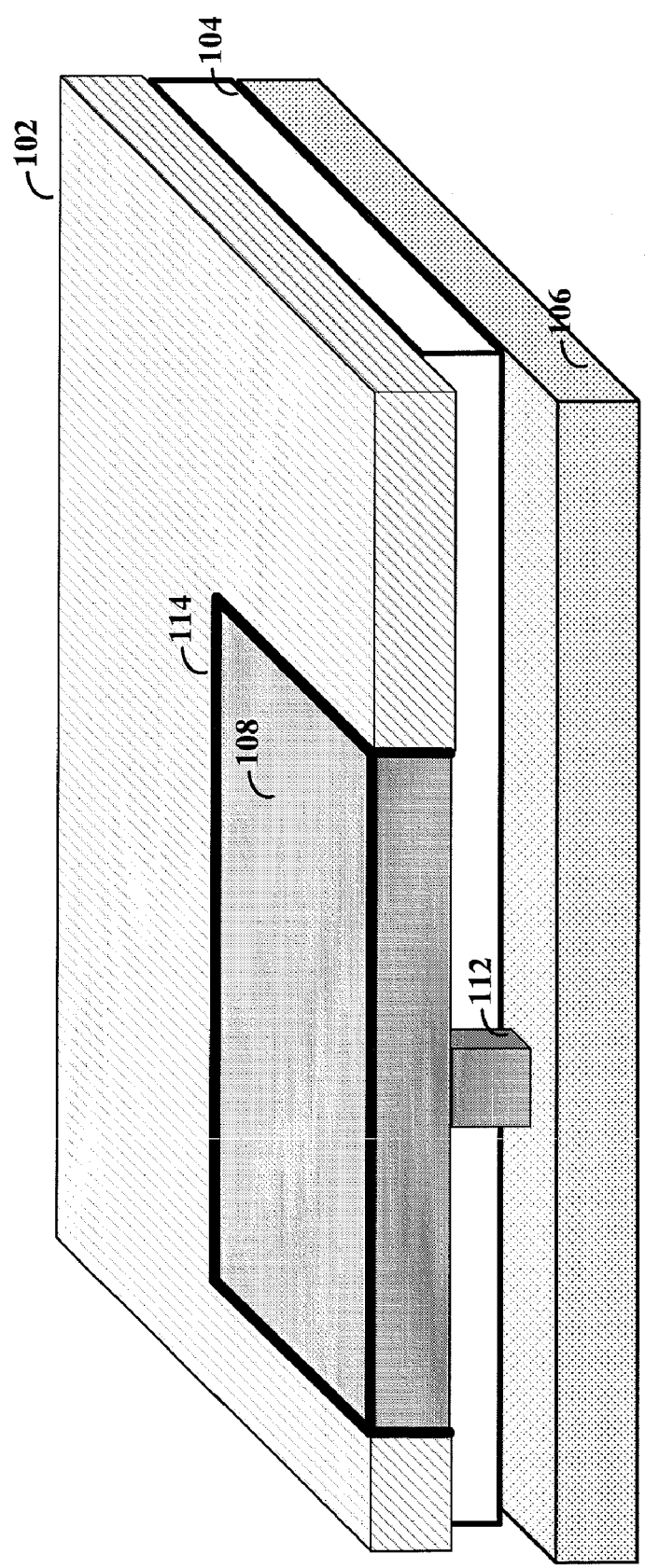
FIG. 2 depicts a cross-section of a semiconductor device for detecting, modulating, amplifying, or emitting light, according to another example of the present invention.

According to another embodiment of the present invention, FIG. 2 depicts a cross-section of a light-communicating semiconductor device. More specifically, FIG. 2 shows one possible seeding location 112. In this instance, the single crystalline structure of region 108 is grown from the substrate at seeding location 112. In other instances, the seeding location could be located at a number of different locations, including, but not limited to, a source above the semiconductor device or layer 102. The Ge-based crystal grows from this seeding location and passes through a narrow area or neck to reduce defects due to lattice mismatches.

Figure 3:
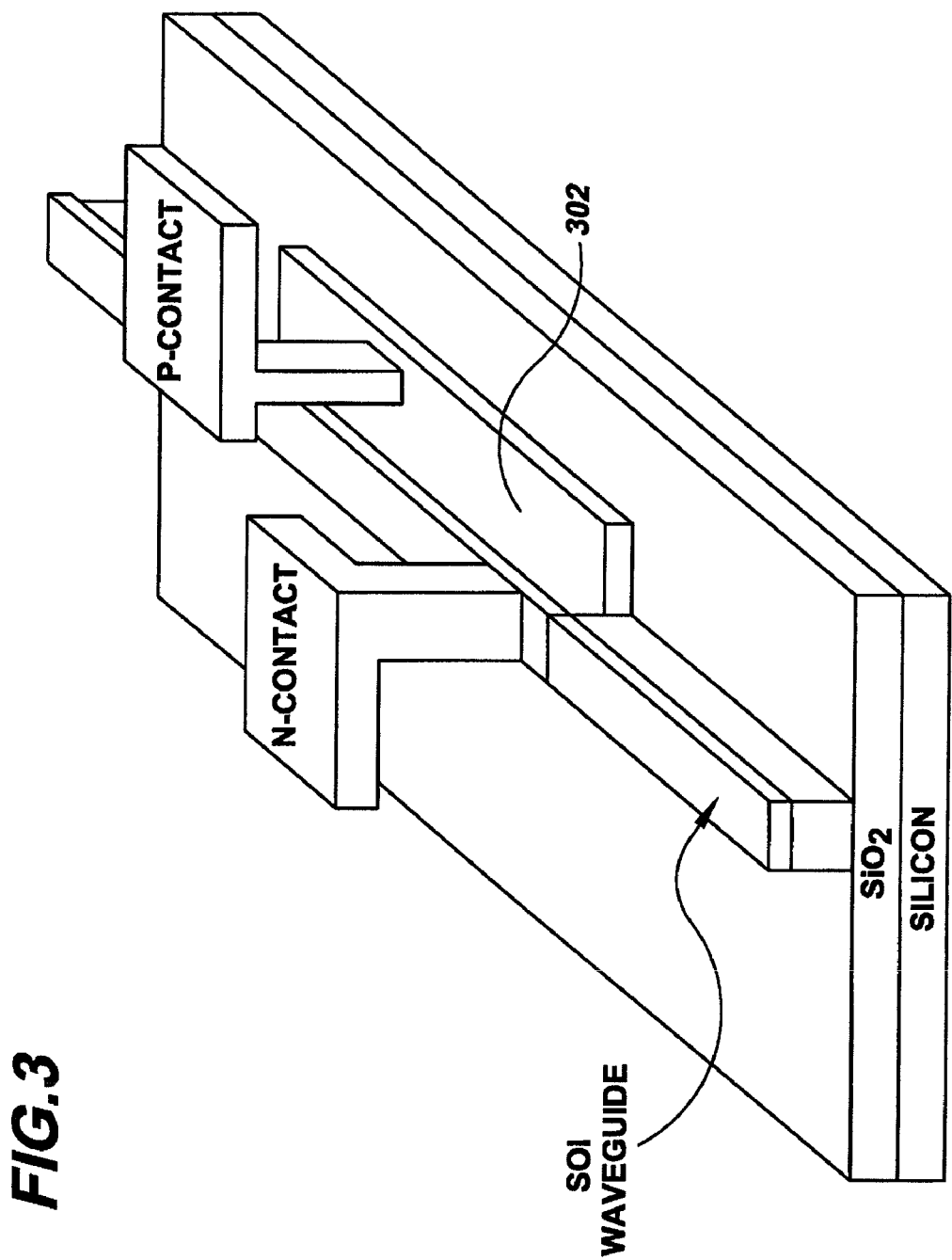
FIG. 3 depicts a semiconductor device for detecting, modulating, amplifying, or emitting light using an SOI waveguide, according to another example of the present invention.

In accordance with other embodiments of the present invention, FIG. 3 depicts a light-communicating semiconductor device using an SOI waveguide, which can be either a photo-detector, light modulator, light-emitter (such as a laser) or an optical amplifier. Active region 302 includes a strained single-crystalline Ge layer with additional layers forming a diode, such as a PIP, PIN or PIP diode. Also, the intrinsic region of the diodes can be a bulk material or can be quantum wells to yield additional optical functionality. In one instance, the waveguide photo-detector of FIG. 3 is constructed using a particular method of manufacturing that incorporates an RMG technique on an SOI substrate. Such a method uses either the bottom silicon or the top silicon of an SOI substrate as a seed layer for re-growing Ge. In the waveguide implementation of the detector, the lengths required for good responsivity can be reduced by almost a factor of 10 over unstrained Ge (due to an increase in absorption coefficient), which leads to a similar reduction in capacitance and dark current for the same responsivity. For example, absorption of ~8000 cm$^{-1}$ corresponding to 1.4 um of absorption length results in small capacitances on the order of 1 fF. A low dark current can also provide increased responsivity to low voltage biased devices, such as those used in many CMOS compatible devices.

According to another example embodiment of the present invention, PIN and metal-semiconductor-metal (MSM) photodetectors can be implemented. For such photodetectors, the strained Ge thin film can be manufactured on either a silicon or SOI substrate. This can be followed by slapping patterned metal on top for MSM or using a doping implant or in-situ growth for PIN (both lateral and vertical). For MSM photodetectors, the transit-time dictated speed limits the thickness of the active area. Thus, a high absorption will render a much larger responsivity for the same bandwidth constraints. Likewise for PIN detectors, the responsivity will increase for same capacitance and transit times.

Figure 4:
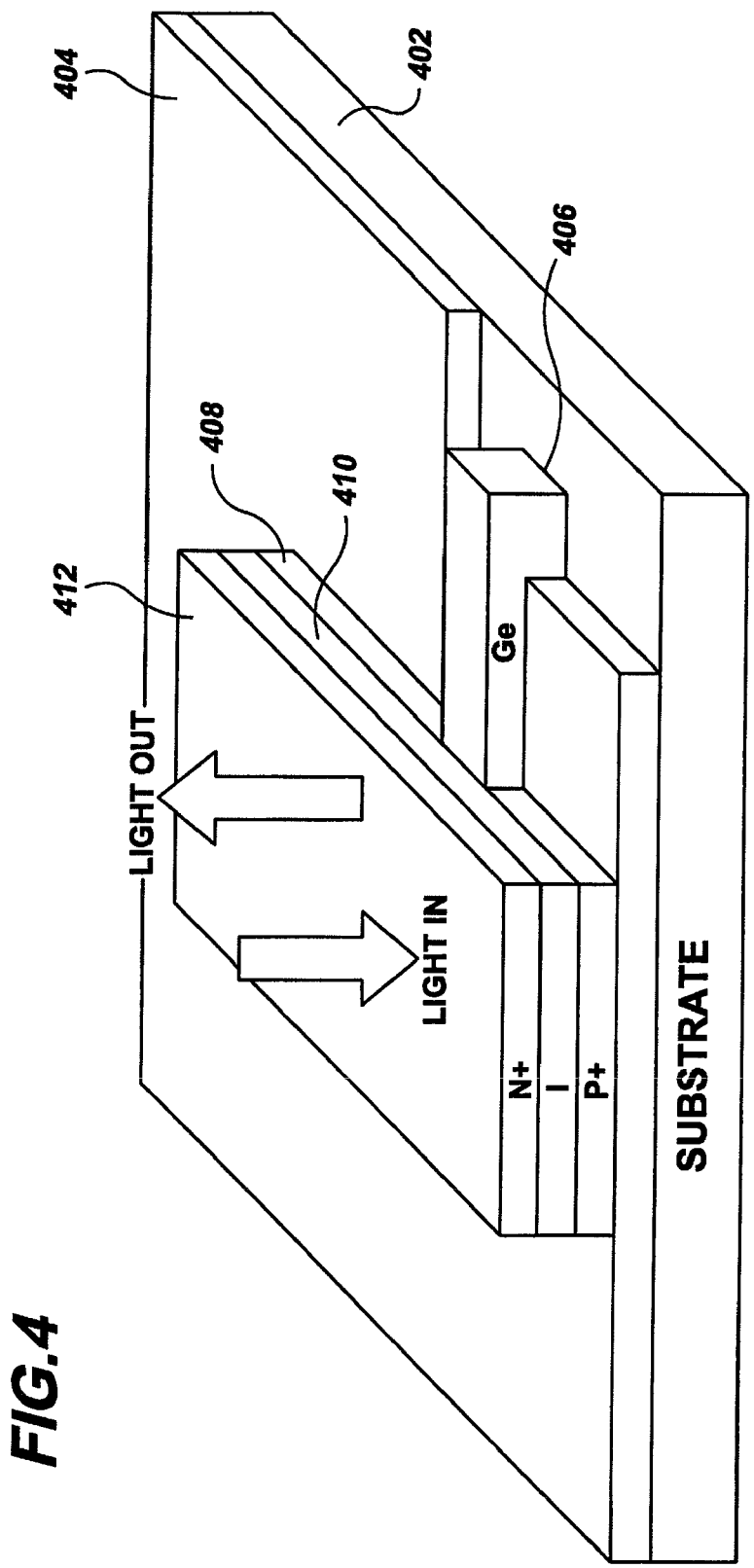
FIG. 4 depicts a semiconductor device for detecting, modulating, amplifying or emitting light using an SOI waveguide, according to another example of the present invention.

FIG. 4 depicts a substantially surface-normal (e.g. substantially surface normal with respect to the surface) optical device, according to an example embodiment of the present invention. In such devices, light is directed to the active areas 408, 410 and 412 in a direction substantially perpendicular to the active areas. Such surface normal can be configured in a variety of different arrangements, including various bulk or quantum well diode configurations. For instance, FIG. 4 shows a PIN diode arrangement that includes P+ region 408, intrinsic region 410 and N+ region 412; however, one skilled in the art would recognize that various other arrangements can be implemented including bulk detectors and PIP or NIN diodes. Such arrangements can be implemented using the various crystalline-growth and tensile-strain techniques discussed herein. For instance, a single-crystalline Ge-based layer 408 can be grown from the substrate 402 at seeding location 406. Layer 402 can be either bulk Silicon or SOI or any other single crystal material conducive for seeding. Additional layers, such as 410 and 412, can be grown or otherwise constructed on top of Ge-based layer 408. Layer 410 can be a single intrinsic layer or multiple quantum wells embedded in the intrinsic part of the PIN diode. The material for layer 404 has a coefficient of expansion different from layer 408 to produce the desired strain on Ge-based layer 408. For certain applications it can be useful to select a material for layer 404 that has desirable optical qualities. More specifically, the layer 404 can be constructed using a dielectric material that acts as a reflective layer to help direct light through the active layers or trap light in the active layers through cavity operations. In certain applications, such as lasers, modulators and detectors, layer 404 can be constructed to act as a mirror for a resonant cavity for light of a desired frequency.

In a different embodiment in FIG. 4, the entire thickness including layers 408, 410, and 412 is initially a single crystal Ge-based layer that can be grown from substrate 402 at the seeding location 406. Subsequently, layers 408, 410, and 412 are demarcated by doping different parts of the initial thick layer using different dopant types and concentrations. This is used to create various PIN, PIP, NIN diodes. The doping techniques can be ion-implantation or any other suitable technique known to those skilled in the art.

In another example embodiment of FIG. 4, the pre-crystallized Ge-based layer itself is created with the required doping regions to create desired diodes. The thick layer is subsequently crystallized from substrate 402 at the seeding location 406. The crystallization preserves the original intended dopant demarcation to yield the desired PIN, NIN, or PIP diode.

Figure 5:
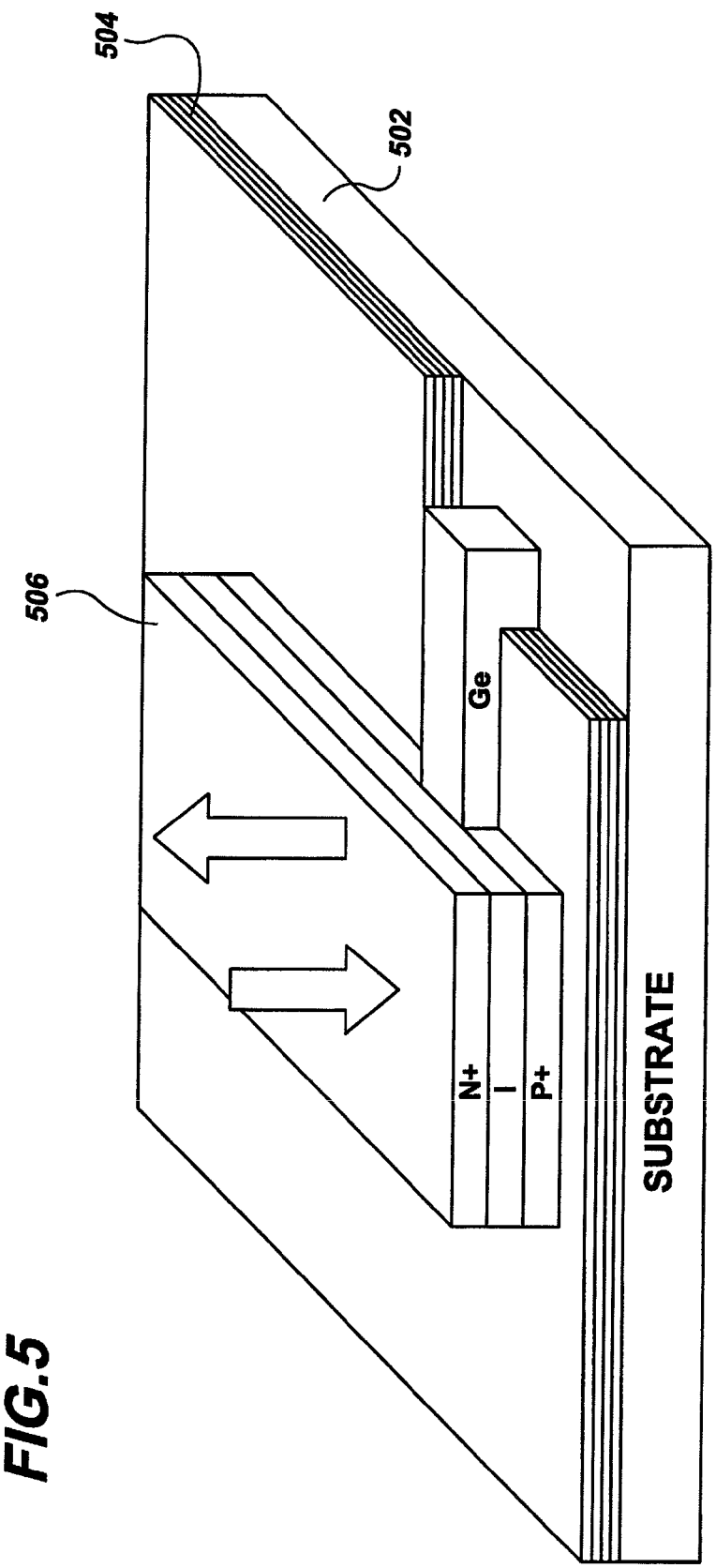
FIG. 5 depicts a semiconductor device for detecting, modulating, amplifying, or emitting light using an SOI waveguide, according to another example of the present invention.

FIG. 5 depicts a substantially surface-normal optical device, according to an example embodiment of the present invention. Between substrate 502 and active area 506, is a dielectric layer 504. This dielectric layer 504 includes a stack of multiple different layers. These layers can be arranged to produce dielectric mirrors and/or mirrors for resonant cavities for the optical device. In some applications similar, additional layers can be arranged on top of active area 506.

In certain applications, the thickness of the reflective layers 404, 504 can be modified to accommodate device specific parameters, such as the wavelength of the incident light.

According to another example embodiment of the present invention, a layer of material different from the single-crystalline layer may be constructed on top of the single-crystalline layer. This is particularly useful for creating devices having active regions constructed from the different material (e.g., GaAs), where the different material is lattice matched with the single-crystalline layer but not necessarily with silicon. Thus, the devices can be constructed for a variety of different wavelengths, efficiencies and capacitance by selecting different materials for communicating light.

According to another example embodiment of the present invention, a light emitter is implemented using vertical PIN diode with a lateral waveguide. The waveguide provides transverse mode confinement for laser applications. For a PIN structure, one possibility is that the entire PIN stack can be grown on top of the insulator with the P+ and N+ regions in SiGe and the intrinsic region in the strained Ge making a heterostructure. The SiGe layers can be useful for confining both electrons and holes, specifically targeting the gamma valley confinement. A second possibility is to grow a thin insulator on top of a P+ or an N+ region and grow the remaining intrinsic region and the other electrode (N+ or P+ region) of the PIN diode on top of the insulator. This is particularly useful for effective strain transfer to the active intrinsic region. Care has to be taken in selecting an insulator whose asymmetric band offsets with Ge are such that they provide the right confinement for the carrier from the top electrode, but do not impede diffusion of carriers from the underlying electrode. This could be achieved by using appropriate dielectrics. A third possibility is to grow quantum wells in the intrinsic region using a varying concentration of SiGe. The dimensions and the SiGe concentrations in the quantum well will change bandstructure both directly and through change in the confinement. The different SiGe concentrations will also result in different strain, which can also be used to manipulate band-structure to achieve the desired wavelength operation for any of the light-communicating devices discussed herein.

According to another example embodiment of the present invention, mirrors can be constructed at the end of waveguides using high contrast ratio materials. A specific embodiment of the mirror could be a two-layer stack of Si/SiO2, which, because of a high index contrast, is capable of yielding high reflectivity (e.g., greater than 90 percent). Another possible embodiment of this technique is to have DBR or DFB mirrors etched or deposited directly on the waveguide. These mirrors separate the active (single crystal material) and the passive (silicon) waveguide and create a resonant cavity around the active material, which is useful for lasers, photodetectors, modulators, and amplifiers, any of which can be implemented in the active area.

In addition to the aforementioned bandgap engineering using strain, Ge could also be made into an efficient light emitter by injecting carriers directly into the Gamma valley using either clever electroluminiscence or using a lower wavelength photoluminiscence. Once the electrons are in the gamma valley, they tend to scatter into the lower L valley. However, using a smaller recombination time compared to the scatter time to the L valley or by pre-filling the L valley with carriers can yield efficient light emission.

The present invention is applicable to the references listed below. Various example embodiments of the present invention, including those discussed above, may be implemented and/or modified in a manner related to one or more of the following references. These references include U.S. Pat. Nos. 6,897,471 and 6,946,318, as well as the following (each being incorporated herein by reference in its entirety): Y. Ishikawa et. al., Applied Physics Letters, Vol. 82, No. 13, Mar. 31, 2003, which is relevant to tensile strain of GE; O. I. Dosunmu et. al., IEEE Journal of selected topics in quantum electronics, Vol. 10, No. 4, July/August 2004, which is relevant to tensile strain of GE grown on Si; Y. H. Kuo et. al., Nature, Vol. 437, No. 27, October 2005, pp. 1334-1336, which discusses SiGe-based modulators for longer wavelengths; O. I. Dosunmu et. al., IEEE Journal of Selected Topics in Quantum Electronics, Vol. 10, No. 4, July/August 2004, and A. K. Okyay et. al. CLEO Conference, 2006, which provide techniques for tensile-strain Ge; and M. V. Fischetti and S. E Laux, J. Appl. Phys. 80, (4), 15 Aug. 1996, pp. 2234-2252, which discusses tensile-strain relative to aspects of Ge.

The various embodiments described above are provided by way of illustration only and should not be construed to limit the invention. Based upon the above discussion and illustrations, those skilled in the art will readily recognize that various modifications and changes may be made to the present invention without strictly following the exemplary embodiments and applications illustrated and described herein. Such modifications and changes do not depart from the true spirit and scope of the present invention, which is set forth in the following claims.

What is claimed is:

1. A method of manufacturing a light-communicating semiconductor device, the method comprising:
   depositing a germanium-based material onto a semiconductor device;
   changing the germanium-based material to a semi-solid state by heating the germanium-based material;
   directing the growth of a crystalline structure from the germanium-based material, the growth following a path beginning at a seeding location, passing through a small opening that mitigates defects in the grown crystalline structure and continuing adjacent to another material; and
   cooling the grown crystalline structure and the adjacent material and therein introducing a tensile strain to the crystalline structure.

2. The method of claim 1, wherein the crystalline structure has a bandgap that is sufficiently close to direct bandgap for the device to function as a direct bandgap light generating device.

3. The method of claim 1, wherein the grown crystalline structure and the adjacent material have different coefficients of expansion.

4. The method of claim 1, further including the step of doping portions of the crystalline structure to produce one of P and N portions.

5. The method of claim 1, further including the step of creating one of a PIP, NIN and PIN diode using the grown crystalline structure to epitaxially grow the diode.

6. The method of claim 1, wherein the seeding location is on a silicon substrate physically coupled to the semiconductor device.

7. The method of claim 1, further comprising:
   forming a layer of an inert-type material on a silicon substrate;
   patterning an opening in the inert-type material and exposing the silicon substrate to form the seeding location; and
   wherein directing the growth of the crystalline germanium from the silicon seed location includes growing crystalline germanium in a first direction upward from the silicon seed location and growing single-crystalline germanium over the inert-type material and in a lateral direction from the silicon seed location.

8. The method of claim 1, wherein the grown crystalline structure is thicker than about 10 nanometers.

9. The method of claim 1, wherein the tensile stain is controlled by modifying one or more of a temperature used to heat the germanium-based material, an amount of time the germanium-based material is heated and a rate at which the germanium-based material is cooled.

10. The method of claim 1, further including the step of controlling the thickness of the adjacent material to match a wavelength of light used by the device.

11. The method of claim 1, wherein the steps of depositing, changing, directing and cooling are repeated to produce another single-crystalline germanium area having a different tensile strain.

12. The method of claim 1, wherein the tensile strain is a high tensile strain which results from a difference in thermal coefficients between the other adjacent material and the grown crystalline structure.

13. The method of claim 1, wherein: the grown crystalline structure is between about 20 nanometers and about 800 nanometers.

14. The method of claim 1, wherein the other adjacent material is one of an oxide and nitride.

15. The method of claim 1, wherein the crystalline structure is epitaxial grown from the germanium-based material.

16. The method of claim 5, further comprising placing waveguide on top of the grown crystalline structure in which the waveguide directs light to the diode.

17. The method of claim 1, further placing one of doped polysilicon contacts and transparent carbon-nanotube (CNT) based metal contacts on the grown crystalline structure.

18. The method of claim 1, wherein the tensile strain is between about 0.3 percent and 1.2 percent.

19. A method of manufacturing a light-communicating semiconductor device, the method comprising:
    forming an insulating layer on a silicon substrate;
    patterning an opening in the insulating layer and exposing the silicon substrate to form a seeding location;
    forming a layer of germanium-based material over the insulating layer, and therein at extending the germanium-based material through the opening to the silicon substrate;
    changing the germanium-based material to a semi-solid state by heating the germanium-based material;
    after forming the layer of germanium-based material, directing the growth of a crystalline structure, the growth following a path beginning at the seeding location and continuing throughout the germanium-based material layer, wherein the growth through the opening mitigates defects in the grown crystalline structure and continuing adjacent to another material; and
    cooling the grown crystalline structure and the adjacent material and therein introducing a tensile strain to the crystalline structure.

20. The method of claim 16, wherein the tensile strain results in a bandgap of the crystalline structure that is sufficiently close to direct bandgap.

21. A method of manufacturing a light-communicating semiconductor device, the method comprising:
    forming an insulating layer on a silicon substrate;
    patterning an opening in the insulating layer and exposing the silicon substrate to form a seeding location; and
    epitaxially growing a crystalline structure from a germanium-based material within the opening and over the insulating layer along a path starting at the seeding location.

22. The method of claim 21, wherein the crystalline structure is epitaxially grown by:
    depositing a layer of germanium-based material over the opening and the insulating layer seeding location and continuing throughout the germanium-based material layer;
    changing the layer of germanium-based material to a semi-solid state by heating the layer of germanium-based material to grow the crystalline structure; and
    cooling the grown crystalline structure and the insulating layer and therein introducing a tensile strain to the crystalline structure.

* * * * *